(12) United States Patent
Shankar

(10) Patent No.: US 10,135,432 B2
(45) Date of Patent: Nov. 20, 2018

(54) METHODS AND APPARATUS FOR LOW CURRENT CONTROL FOR A POWER CONNECTION

(71) Applicant: Texas Instruments Incorporated, Dallas, TX (US)

(72) Inventor: K Ganapathi Shankar, Bangalore (IN)

(73) Assignee: Texas Instruments Incorporated, Dallas, TX (US)

(*) Notice: Subject to any disclaimer, the term of this patent is extended or adjusted under 35 U.S.C. 154(b) by 33 days.

(21) Appl. No.: 15/275,875

(22) Filed: Sep. 26, 2016

(65) Prior Publication Data

US 2018/0069546 A1 Mar. 8, 2018

Related U.S. Application Data

(60) Provisional application No. 62/384,558, filed on Sep. 7, 2016.

(51) Int. Cl.
*H03K 17/0812* (2006.01)
*H03K 17/06* (2006.01)
*H03K 17/08* (2006.01)

(52) U.S. Cl.
CPC ....... *H03K 17/08122* (2013.01); *H03K 17/06* (2013.01); *H03K 17/063* (2013.01); *H03K 17/08* (2013.01); *H03K 17/0812* (2013.01)

(58) Field of Classification Search
CPC ........... H03K 17/08122; H03K 17/812; H03K 17/06; H03K 17/08; H03K 17/063
See application file for complete search history.

(56) References Cited

U.S. PATENT DOCUMENTS

| | | | | |
|---|---|---|---|---|
| 6,222,403 B1* | 4/2001 | Mitsuda | ........... | H03K 19/00361 |
| | | | | 326/26 |
| 6,680,837 B1* | 1/2004 | Buxton | ................... | H02H 3/087 |
| | | | | 327/309 |
| 7,106,033 B1* | 9/2006 | Liu | ........................ | G05F 1/575 |
| | | | | 323/280 |
| 9,459,639 B2* | 10/2016 | Kasai | ........................ | G05F 1/56 |
| 2009/0002054 A1* | 1/2009 | Tsunoda | ............. | H03K 17/0406 |
| | | | | 327/374 |
| 2010/0259235 A1* | 10/2010 | Ozalevli | ................... | G05F 1/56 |
| | | | | 323/274 |
| 2011/0080761 A1* | 4/2011 | Kung | .................... | H02M 7/219 |
| | | | | 363/127 |
| 2012/0081092 A1* | 4/2012 | Pavlin | ...................... | G05F 1/46 |
| | | | | 323/282 |
| 2013/0214823 A1* | 8/2013 | Kawamoto | ............ | H02H 9/025 |
| | | | | 327/109 |
| 2013/0285630 A1* | 10/2013 | Wang | ........................ | G05F 1/10 |
| | | | | 323/275 |

(Continued)

*Primary Examiner* — Thomas J Hiltunen
(74) *Attorney, Agent, or Firm* — Lawrence J. Bassuk; Charles A. Brill; Frank D. Cimino

(57) ABSTRACT

Described examples include a controller having a first current source. The first current source has an output terminal coupled to a control terminal of a switch. A second current source has an output terminal coupled to the control terminal of the switch. The second current source provides current to the control terminal when the voltage on the control terminal is below a threshold. In accordance with another example, the switch is a field effect transistor. In another example, the first current source is driven by a charge pump. Methods are disclosed.

12 Claims, 4 Drawing Sheets

(56) References Cited

U.S. PATENT DOCUMENTS

2013/0315294 A1\* 11/2013 Ishizeki ........... H03K 19/01852
　　　　　　　　　　　　　　　　　　　　375/232
2015/0022258 A1\* 1/2015 Sadate ................. H03K 17/284
　　　　　　　　　　　　　　　　　　　　327/398
2017/0033790 A1\* 2/2017 Osanai ................. H03K 17/567

\* cited by examiner

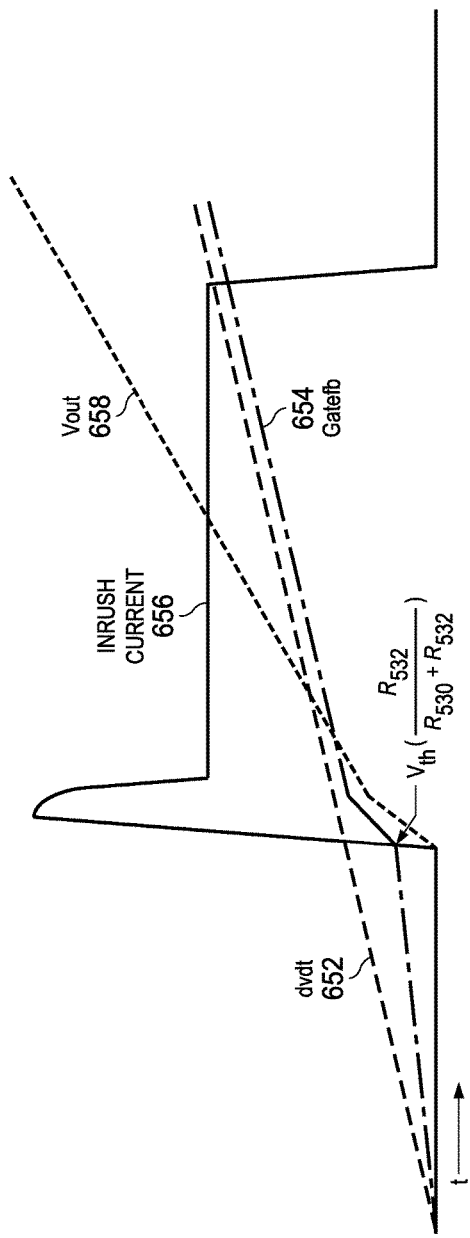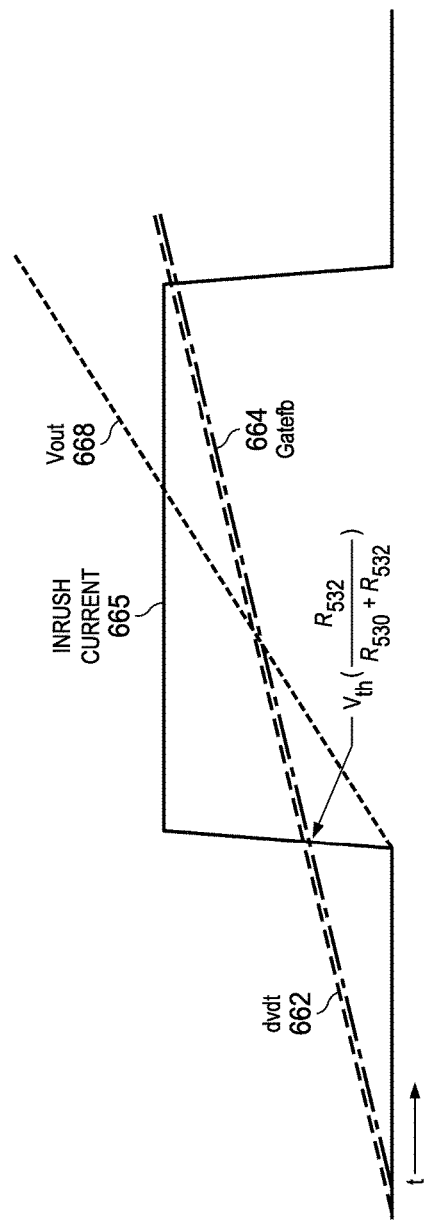

METHODS AND APPARATUS FOR LOW CURRENT CONTROL FOR A POWER CONNECTION

RELATED APPLICATIONS

This application claims the benefit of priority under 35 U.S.C. § 119(e) to co-owned U.S. Provisional Patent Application Ser. No. 62/384,558, filed Sep. 7, 2016, entitled "METHODS AND APPARATUS FOR LOW CURRENT CONTROL FOR A POWER CONNECTION," naming K Ganapathi Shankar as inventor, which application is hereby incorporated by reference in its entirety herein.

TECHNICAL FIELD

This application relates generally to power supply control circuits, and, in particular, to circuits to control the applied power when a circuit is connected to a power supply.

BACKGROUND

E-fuse ("electronic fuse") circuits control a series power transistor that connects a circuit to a power supply. For example, a circuit board may get its power from a bus. When the circuit board is inserted into the bus socket, contacts in the bus socket connect the board to power. Among other functions, an e-fuse controls how the power is applied as the board is powered up. E-fuses often have the following basic controls:
  a. Soft start ("dv/dt control") during initial power up, where the voltage and current supplied to the gate of the power transistor is ramped up at a user set slope so that the output voltage is ramped slowly.
  b. Current limit control, where the power transistor current is monitored and compared against a user set current limit. If the current exceeds the set limit, the e-fuse tries to limit the current by controlling the gate of the power transistor.
  c. Over voltage protection: protection where the input is monitored and compared against a set reference. If the voltage exceeds the reference the gate of power transistor is pulled to zero turning off the power transistor.

In an example application, a power transistor has a drain terminal coupled to a voltage supply and a source terminal coupled to the load. The gate of the power transistor needs to be at a sufficient voltage to turn on the power transistor to provide the power supply voltage level to the output (Vout). To turn on a typical power transistor, the gate voltage has to exceed the source voltage by a threshold voltage. Because the transistor has a low on-resistance (Rdson), the source voltage is at approximately the input voltage, so that the output voltage is approximately equal to the input voltage. Thus, to turn on the power transistor the voltage applied to the gate of the power transistor must be higher than the voltage provided by input power supply (Vin), which is usually the highest voltage level available. A charge pump is usually required to provide a higher voltage at the gate terminal of the power transistor. However, charge pumps are quite inefficient and have large current requirements. Only about 20% of the power used by a charge pump is provided at the output of the charge pump. In addition, to provide large currents, charge pumps require large capacitors, which require a very large area of an integrated circuit.

SUMMARY

In described examples, a controller includes a first current source having an output terminal coupled to a control terminal of a switch; and a second current source having an output terminal coupled to the control terminal of the switch, the second current source providing current when a voltage on the control terminal is below a threshold.

BRIEF DESCRIPTION OF THE DRAWINGS

FIGS. 6A and 6B are graphs of the operation of the circuit of FIG. 5.

DETAILED DESCRIPTION

Corresponding numerals and symbols in the different figures generally refer to corresponding parts unless otherwise indicated. The figures are not necessarily drawn to scale.

The term "coupled" may include connections made with intervening elements, and additional elements and various connections may exist between any elements that are "coupled."

Figure 1:
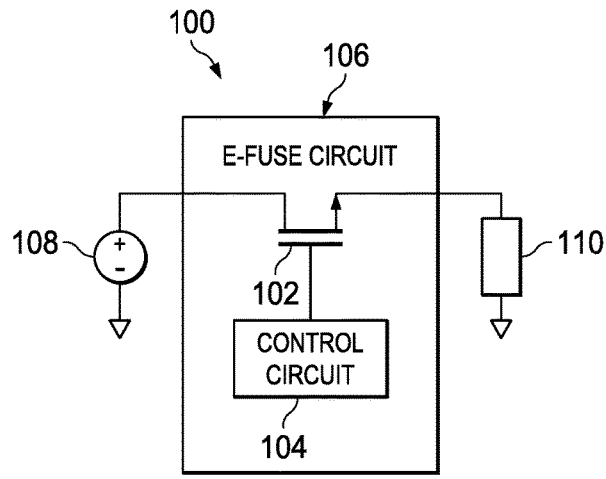
FIG. 1 is a block diagram of an e-fuse circuit.

FIG. 1 is a diagram of a power circuit 100. Power circuit 100 includes an E-fuse circuit 106 coupled between a power source 108 and a load 110. Transistor 102 serves as a switch between power source 108 and load 110. Control circuit 104 controls transistor 102 and determines when power source 108 is connected to load 110 and controls how quickly power is supplied from power source 108 to load 110 when connected. Because the control circuit 104 monitors the current flowing through the transistor 102 and controls the gate to limit the current, it is sometimes referred to as an "e fuse" circuit.

Figure 2:
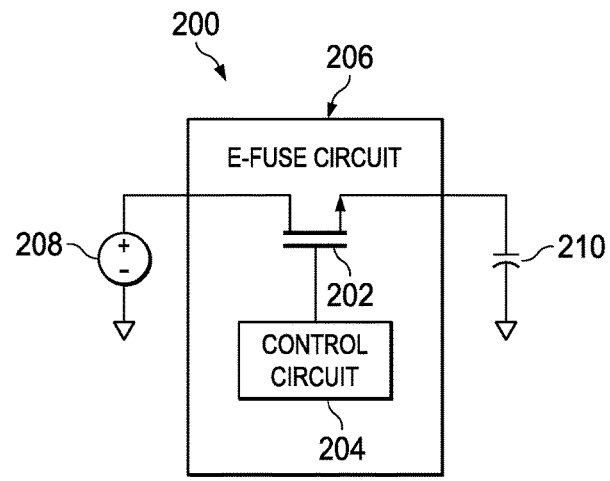
FIG. 2 is a block diagram of another e-fuse circuit.

FIG. 2 is a diagram of another power circuit 200. Similarly, numbered components perform similar functions as elements of power circuit 100 (FIG. 1). For example, transistor 202 performs the same function as transistor 102 of FIG. 1. Power circuit 200 differs from power circuit 100 (FIG. 1) in that load 210 is a capacitive load. In practice, most loads, such as loads 110 (FIG. 1) and load 210 are complex impedances with a large capacitive component.

Figure 3:
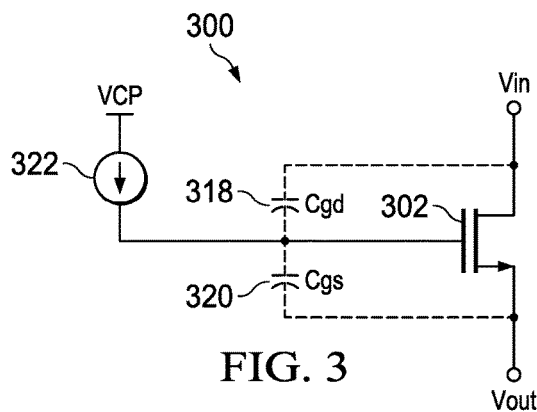
FIG. 3 is a circuit diagram showing the intrinsic capacitances of a power transistor.

FIG. 3 is a diagram showing the intrinsic capacitances of a power transistor 302. Circuit 300 is a simplified version of power circuits 100 and 200 in FIGS. 1 and 2. VCP is a charge pump voltage. To pass a voltage of Vin at Vout, the gate voltage on transistor 302 must be greater than Vout+Vth, where Vth is the gate to source threshold voltage of transistor 302. Under many circumstances, Vin in the highest voltage supply that is readily available. Further, in power circuits the power switch such as 302 in FIG. 3 has a relatively low on-resistance, so that Vout is approximately equal to Vin when the switch 302 is fully turned on. Therefore, a charge pump must be used to generate a voltage VCP that is significantly greater than the supply voltage Vin. For example, the voltage VCP can be Vin+about 7 volts. In the power circuit 300, voltage VCP to drives current source 322 to charge the gate of transistor 302. This current charges parasitic capacitors 320 and 318. In normal operation, the value of capacitor 320 is six to eight times higher than capacitor 318. However, the value of the capacitances seen at the gate by current source 322 depends on the region of operation of transistor 302. During startup from zero, when the source is not following the gate of transistor 302, the current from current source 322 has to charge both capacitances 320 and 318. When the gate voltage exceeds the threshold voltage Vth, the source starts following the gate (source follower mode) and the current has to charge only capacitor 318, as the gate to source capacitor Cgs is boot strapped by gate and source terminals.

Figure 4:
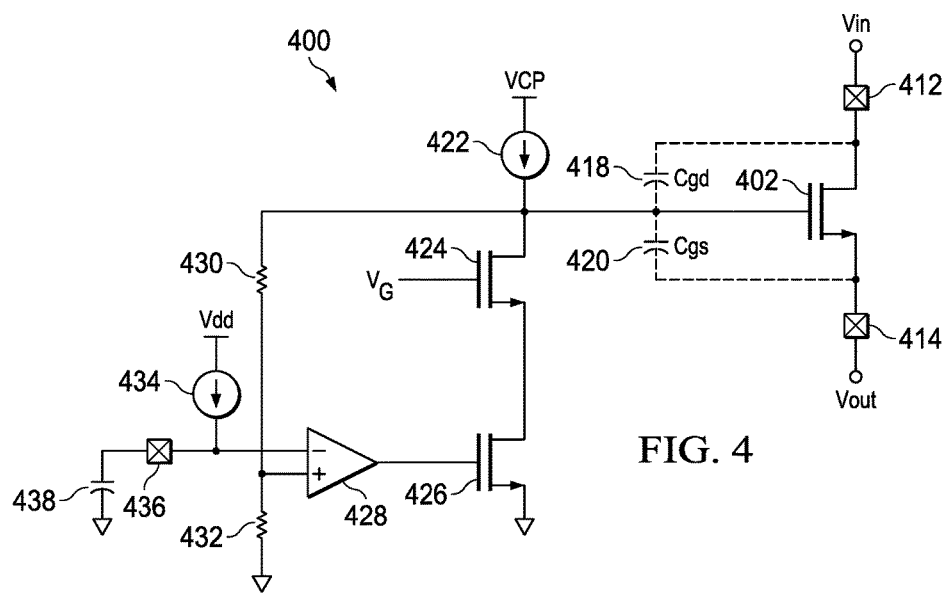
FIG. 4 is a circuit diagram of a driving and control circuit for a power transistor.

FIG. 4 is a drawing of a driving and control circuit 400 arranged for soft start or inrush current control coupled to a power transistor. Circuit 400 drives the gate of power transistor 402. The drain of transistor 402 is coupled to a voltage input terminal 412. The source of transistor 402 is coupled to a voltage output terminal 414. Current source 422 is driven by a high voltage VCP provided by a charge pump circuit (not shown). An external pin 436 is provided for dvdt control. An external capacitor 438 is shown coupled to the pin 436. In an alternative, the external capacitor 438 can be an internal capacitor instead.

In most circumstances, the slope by which the voltage on output terminal 414 increases on power-up is controlled. For example, circuit 400 may be controlling the power connection in a blade computer. Power is applied to the blade computer when it is inserted into a rack. A Vin supply pin in the backplane of the rack supplies the power to operate the blade computer. The voltage on the output Vout powers the components on the blade computer. It is desirable to have this output voltage Vout rise gradually to provide an orderly start-up of components of the blade computer, and to avoid damage from sudden voltage or current spikes. Circuit 400 also controls the inrush current drawn by a capacitance load such as capacitance 210 in FIG. 2, at startup. By selecting the size of capacitor 438 and coupling it to the dvdt pin 436, this allows control of the ramp-up speed of transistor 402.

Still referring to FIG. 4, at start up, current source 434 charges the capacitor 438 at a rate determined by the current output by current source 434 and by the size of capacitor 438. The voltage at the inverting input of op amp 428 is determined by Equation 1:

$$V = \frac{It}{C} \quad [1]$$

Finding the time derivative of Equation 1 yields Equation 2, which gives the start-up slope S:

$$S = \frac{dV}{dt} = \frac{I}{C} \quad [2]$$

Therefore, the slope S is inversely proportional to the size of the capacitor 438.

The non-inverting input of op amp 428 couples to the gate of power transistor 402 through resistor 430. Resistors 430 and 432 serve as a voltage divider so that the voltage at the non-inverting input of op amp 428 is a proportional fraction of the voltage at the gate of transistor 402. When the voltage on the gate of transistor 402 is above the desired slope set by current source 434 and capacitor 438, the voltage at the non-inverting input of op amp 428 is higher than the voltage at the inverting output. In response to the difference at the inputs, op amp 428 provides a high output signal to the gate of transistor 426. Transistor 426 then conducts some of the current supplied by current source 422 through cascode transistor 424. This action will continue until the rise of voltage on the gate of transistor 402 is lowered such that the inputs on both the positive and negative inputs of op amp 428 are equal. A feedback control loop is formed from the output of the operational amplifier 428, through the gate of transistor 426 and the transistor 424, and through the resistor divider of 430 and 432.

As noted hereinabove, the intrinsic gate to source capacitance 420 (Cgs) of the power switch 402 will collapse after the source starts following the gate. The source of power switch 402 starts following the gate when VGS>Vth+Voverdrive for transistor 402, and then power transistor 402 enters source follower mode. In circuit 400, all of the current for charging the gate of transistor 402 is provided by current source 422. However, current source 422 is driven by a charge pump (not shown in FIG. 4). Charge pumps require large on-chip capacitors and are very inefficient. The larger the current requirement, the larger the charge pump becomes. To support the current necessary to charge both intrinsic gate capacitors 418 and 420 at the desired maximum slope, the current is determined by Equation (3):

$$I > S_{max} \times (Cgs + Cgd) \quad [3]$$

However, the current necessary after the gate voltage is above the threshold voltage Vth is determined by Equation (4):

$$I > S_{max} \times (Cgd) \quad [4]$$

For most vertical power MOSFETs that can be used as switch 402, the intrinsic gate to source capacitance Cgs is approximately six to eight times the size of the gate to drain capacitance Cgd. Therefore, to drive the gate of transistor 402 in the saturation region, current source 422 must be six to eight times the size that is necessary to drive the gate of transistor 402 in the above-threshold region. However, as noted hereinabove, charge pumps are very inefficient in terms of both power and integrated circuit area. The larger the charge pump, the greater these inefficiencies.

Figure 5:
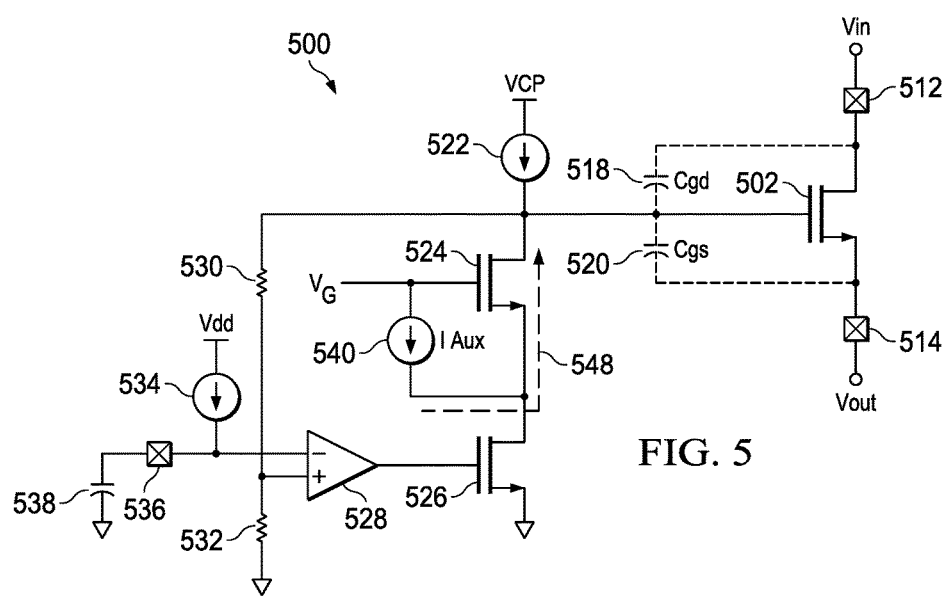
FIG. 5 is a circuit diagram of a circuit embodiment.

FIG. 5 is a drawing of an embodiment for an e-fuse circuit 500. Circuit 500 includes components similar to those of circuit 400 (FIG. 4). Similarly numbered components perform similar functions. For example, capacitor 538 at dvdt pin 536 sets the desired turn on slope for circuit 500, just as capacitor 438 of FIG. 4 does for circuit 400. The rising voltage set by capacitor 538 is applied to the inverting input of op amp 528. Resistors 530 and 532 provide a voltage divider that applies a fraction of the voltage on the gate of transistor 502 to the non-inverting input of op amp 528. If op amp 528 senses that the voltage on the gate of transistor 502 is greater than the slope selected by capacitor 538, excess charge on gate 502 will be drained through the feedback control of transistor 526 and cascode transistor 524.

Circuit 500 also includes auxiliary current source 540 coupled between the gate and the source of cascode transistor 524. Auxiliary current source 540 is sized so that Equation 5 is met:

$$S_{max} = \frac{I(522)}{Cgd} = \frac{I\,Aux\,(540)}{Cgs} \quad [5]$$

Where $S_{max}$ is the highest power-up slope supported by circuit 500.

Thus, auxiliary current source 540 is sized to handle the larger current required to charge the gate to source capacitance Cgs labeled 520, while current source 522 is sized to handle the smaller current required to charge the gate to drain capacitance Cgd. Because the current source 522 provides a smaller current than that in prior approach controller circuits, a smaller charge pump can supply voltage to the current source 522, improving power consumption and reducing integrated circuit area for the charge pump.

Still referring to FIG. 5, when the voltage on the gate of transistor 502 is below $V_G-V_{th}$ (where $V_{th}$ is the threshold voltage of transistor 524), transistor 524 is in the linear region of operation and acts like a small resistor, allowing the current from the auxiliary current source 540 to flow into the gate along pathway 548. After the gate voltage of transistor 502 rises above the voltage $V_G-V_{th}$, this pathway is shut off. In addition, auxiliary current source 540 is designed to shut off after this voltage level is reached, further reducing power consumption.

$V_G$ is set to a relatively low voltage (for example, 4V) so that transistor 524 is non-conductive along the pathway 548 as the drain voltage becomes higher than the source voltage, when the gate voltage on transistor 502 is high (for example, 25V). This accomplishes two functions. First, the threshold voltage $V_t$ of power transistors is usually on the order of 2-3V. Setting $V_G$ to about 4V causes pathway 548 to shut off approximately when the gate voltage of transistor 502 reaches the threshold voltage of transistor 502, and thus when capacitance 520 (Cgs) collapses. Therefore, auxiliary current source 540 only provides current when necessary to charge the capacitance Cgs to turn on transistor 502.

Second, setting $V_G$ at a lower voltage allows for the use of five volt CMOS designs for auxiliary current source 540, op amp 528 and transistor 526 because these components are protected from the higher voltages by transistor 524 (and resistors 530 and 532). In addition, because auxiliary current source 540 only operates at voltages below $V_G-V_{th}$, auxiliary current source 540 does not require charge pumped level voltages and thus is much more efficient than current source 522. Thus, auxiliary current source 540 can provide a relatively large current, but is still small and efficient.

In an example embodiment, current source 522, cascode transistor 524, auxiliary current source 540, transistor 526, op amp 528, current source 534 and power switch 502 can be formed on a single integrated circuit. Capacitor 538 can be an external capacitor as shown in FIG. 5. In an alternative example, the power switch 502 can be in one integrated circuit, while the remaining components are on another separate integrated circuit. In a further alternative, discrete components can form some or all of the components of circuit 500. The power switch 502 can be implemented using a wide variety of commercially available devices including back-to-back power FETs, single power FETs, SOI FETs, bipolar junction transistors (BJTs) and mechanical relay switches. Vertical FETs and lateral FETs such as LDMOS FETs can be used. Multi-chip modules can form packages for the switch and the remaining circuitry in a single packaged device, even when separate integrated circuits are used to implement the switch and the remaining components. Alternative examples include implementing the circuits as an integrated circuit for controlling a separate switch. In another alternative example, a module or circuit board can form the embodiments and can use discrete components to implement the components. In further alternatives, the embodiments can use off the shelf integrated circuits, such as logic circuits, operational amplifiers and power devices.

FIGS. 6A and 6B are graphs of the operation of the circuit embodiments of FIG. 5. FIG. 6A shows the power-up phase without using auxiliary current source 540 (FIG. 5). FIG. 6B shows the power-up phase obtained for an embodiment using auxiliary current source 540.

In FIG. 6A, line 652, labeled "dvdt," is the slope established by value of capacitor 538 (FIG. 5). Line 654, labeled "Gatefb," is the gate feedback voltage at the non-inverting input of op amp 528 (FIG. 5). Line 656 is the current from terminal 512 to terminal 514 (FIG. 5). This shows the inrush current from the initial charging of the capacitive load(s) connected to Vout. Line 658 is the voltage on Vout.

Ideally, line 654 should track line 652. However, in the example of FIG. 6A, current source 522 (FIG. 5) does not have the capacity to charge both Cgs capacitance 520 and Cgd capacitance 518 (FIG. 5) at the desired slope. Thus, line 654 lags below line 652 until the threshold voltage of transistor 502 (FIG. 5) is reached. The point at which transistor 502 (FIG. 5) begins to conduct is where the voltage on the gate of transistor 502 reaches its threshold voltage $V_{th}$. At this point, the voltage on the non-inverting input of op amp 528 is determined by Equation [6]:

$$V_{th}\left(\frac{R_{532}}{R_{530}+R_{532}}\right) + V_{overdrive} \text{ (required to conduct)} \quad [6]$$

This point is also labeled in FIG. 6A.

Still referring to FIG. 6A, when the gate of transistor 502 (FIG. 5) reaches $V_{th}$, the intrinsic gate to source capacitance 520 (Cgs) collapses, and current source 522 must only charge capacitance 518 (Cgd, FIG. 5). As is seen by observing line 654, this allows the Gatefb to rapidly recover to the dvdt level. However, during the recovery period, a combination of the collapse of the gate-to-source capacitance (Cgs) and the much lower capacitance driven by current source 522 (FIG. 5) causes a spike in the inrush current, as seen in the peak in line 656. This spike is undesirable for a number of reasons, but foremost is the possibility of circuit damage. When the voltage on the gate of power switch 502 (FIG. 5), reaches the desired slope 652, the feedback mechanism of the circuitry of FIG. 5 regains control and forces the inrush current to a plateau after the initial spike, as shown in line 656. After enough inrush current has charged the capacitance of the load on terminal 514 (FIG. 5) to approximately Vin (i.e. Vout=Vin), the inrush current goes to near zero, as shown in line 656 at the right side of FIG. 6A.

FIG. 6B shows the power-up phase for an embodiment using auxiliary current source 540 in FIG. 5. Line 662, labeled "dvdt," is the slope established by value of capacitor 538 (FIG. 5). Line 664, labeled "Gatefb," is the gate feedback voltage at the non-inverting input of op amp 528 (FIG. 5). Line 665 is the current from terminal 512 to terminal 514 (FIG. 5). Line 665 shows the inrush current from the initial charging of the capacitive load connected to Vout. Line 668 is the voltage on Vout. Because of the additional current provided by auxiliary current source 540, Gatefb, as shown by line 664, tracks the desired slope of line 662 very closely. Also, because the gate voltage on transistor 502 (FIG. 5) more closely tracks the desired output, the inrush current shown in line 665 begins a little earlier (than in the example of FIG. 6A.) In FIG. 6B, there is no unwanted spike in line 665 when the inrush current begins for two reasons. First, there is no "catch up" period where Gatefb (line 664) is far below the dvdt (line 662). Therefore, Gatefb (at the non-inverting input of op amp 528) and dvdt (at the inverting input of op amp 528) are very close. This means that op amp 528 (FIG. 5) can react very quickly to control the current going to the gate of transistor 502 (FIG. 5) and cut off any current spike. Second, auxiliary current source 540 (FIG. 5) is designed to shut down after the voltage at the gate of transistor 502 (FIG. 5) reaches $V_G$-$V_{th}$ (where $V_{th}$ is the threshold for transistor 524 in FIG. 5). The current of auxiliary current source 540 (FIG. 5) is designed to match the current necessary to charge capacitance 520 (Cgs, FIG. 5). Therefore, current source 522 (FIG. 5) only provides the current to charge capacitance 528 (Cgd, FIG. 5). Because current source 522 is providing the same current necessary to charge capacitance 528 (Cgd, FIG. 5), both before and after the collapse of capacitance 520 (Cgs, FIG. 5), circuit 500 provides a very smooth power-up slope as shown in line 668 in FIG. 6, Vout.

Figure 7:
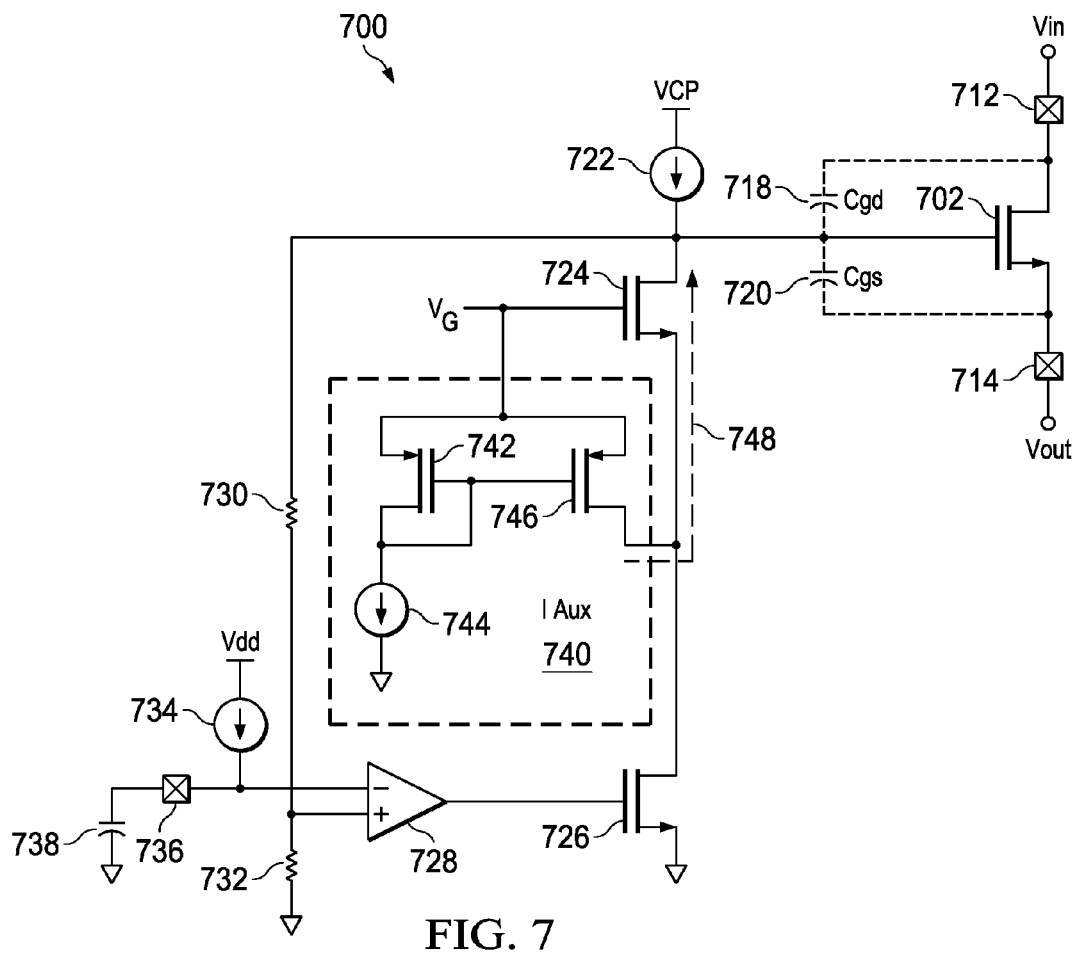
FIG. 7 is a circuit diagram of another circuit embodiment.

FIG. 7 is a diagram of another alternative embodiment. Components in FIG. 7 that have a similar function to the components in FIG. 5 have similar reference numbers. For example transistor 702, current source 722, cascode transistor 724, transistor 726, op amp 728 resistor 730, resistor 732, current source 734 and capacitor 738 perform similar functions as transistor 502, current source 522, cascode transistor 524, transistor 526, op amp 528 resistor 530, resistor 532, current source 534 and capacitor 538, respectively, in circuit 500 (FIG. 5). In the embodiment shown in FIG. 7, a specific example implementation of auxiliary current source 740 is included.

Auxiliary current source 740 includes two p-channel transistors 742 and 746 in a mirrored configuration. Current source 744 pulls a known current through transistor 742. $V_G$ is set, in this example, to approximately 4V. This voltage level is chosen to be the threshold voltage $V_{th}$ of transistor 702 plus $V_{th}$ of transistor 724 plus an extra margin to insure smooth operation. As noted hereinabove, at start-up the voltage on the gate of transistor 702 is zero. Thus, the voltage at the drain of cascode transistor 724 is zero. In this state, the voltage $V_G$ causes cascode 724 to become conductive, allowing mirrored current 748 to flow backward through transistor 724 to the gate of transistor 702. Transistor 742 is smaller than transistor 746. Therefore, because of the current mirror effect, the current through transistor 746 is larger than the current through transistor 742 in proportion to the sizes of the transistors. Thus, a proportionally small current through transistor 742 causes a proportionally larger current through transistor 746. While the voltage on the gate of transistor 702 is below $V_G$ less the threshold voltage of transistor 724, auxiliary current source 740 provides current to the gate of transistor 702 through cascode transistor 724.

Any excess current provided by auxiliary current source 740 will cause op amp 728 to turn on transistor 726, which will allow the excess current to flow through to ground. After the gate voltage of transistor 702 is greater than $V_G$-$V_{th}$, transistor 724 will shut off along pathway 748 and not allow current to flow in the reverse direction.

After the gate voltage of transistor 702 is greater than $V_G$-$V_{th}$, transistors 724 and 746 will be in one of two states. In the first state, transistor 726 is turned on to draw current from the gate of transistor 702 and thus control the voltage on the gate of transistor 702. In this state, the drain of transistor 746 is pulled to near ground because transistor 726 is conductive. Any current flowing through transistor 746 will flow to ground through transistor 726.

In the second state, transistor 726 is off. Current flow through transistor 746 will continue until the voltage on the source of transistor 724 is $V_G$-Vth (of transistor 724). At this point, transistor 724 is non-conductive along pathway 748. Current may flow through transistor 746 until the drain of transistor 746 is near $V_G$. Once the drain voltage of transistor 746 reaches $V_G$, there is no source to drain voltage across transistor 746 and no current will flow through transistor 746. Thus, under all circumstances, once the gate of transistor 702 passes above $V_G$-Vth, auxiliary current source 740 will not provide any more current to the gate of transistor 702.

In an example embodiment, current source 722, cascode transistor 724, auxiliary current source 740, transistor 726, op amp 728, current source 734 and switch 702 can be implemented as a single integrated circuit. Capacitor 738 can be an external component as shown in FIG. 7. In an alternative example, the switch 702 can be in one integrated circuit, while the remaining components are on another separate integrated circuit. In a further alternative, discrete components can form some or all of the components of circuit 700. The switch 702 can be a wide variety of commercially available devices including back-to-back power FETs, single power FETs, SOI FETs, bipolar junction transistors (BJTs) and mechanical relay switches. Multi-chip modules can form packages for the switch and the remaining circuitry in a single packaged device, even when separate integrated circuits implement the switch and the remaining components. Alternative examples include implementing the circuits as an integrated circuit for controlling a separate switch. In another alternative example, a module or circuit board can form the embodiments of the present application and can use discrete components to implement the components. In further alternatives, the embodiments can be formed using off the shelf integrated circuits, such as logic circuits, operational amplifiers and power devices.

In a method, a controller controls a power switch by supplying a first current to a supplying a first current to a control terminal of a power transistor; and supplying a second current to the control terminal until the voltage on the control terminal is greater than a threshold voltage. The second current is larger than the first current. In a further method, the rise rate of the voltage on the control terminal is selectively controlled. In another example the power switch is a power transistor. In a further example the power transistor is a field effect transistor. In yet another example method, the threshold voltage is greater than the threshold voltage of the power transistor.

In described examples, a controller includes a first current source having an output terminal coupled to a control terminal of a switch. A second current source has an output terminal coupled to the control terminal of the switch. The second current source provides current when the voltage on the control terminal is below a threshold.

In another example, the controller includes a power up control to selectably set the rise rate of the voltage on the control terminal of the switch.

In another example, the controller controls the rise rate of the voltage on the control terminal of the switch using a feedback loop.

In another example, the second current source is coupled to the control terminal of the switch via a cascode transistor.

In another example, the first current source is driven by a bootstrapped voltage supply.

In another example, the switch is a transistor and a first current handling terminal of the transistor is coupled to a voltage supply that is provided to the second current handling terminal of the transistor under control of the controller. In another example, the transistor is a field effect transistor.

In another example, a controller for controlling a first field effect transistor coupled between a power supply having a first output voltage and supplied node, and having a gate coupled to a control terminal includes a voltage rate rise reference having an output voltage with a selectable rise rate. An op amp has an inverting output coupled to the output voltage of the voltage rate rise reference and has an output coupled to the gate of a second field effect transistor, the source of the second field effect transistor is coupled to a reference potential. A third field effect transistor has a gate coupled to a threshold potential, a source coupled to a drain of the first field effect transistor and a drain coupled to the control terminal. A voltage divider has an undivided voltage input coupled to the control terminal and a divided output coupled to a non-inverting input of the op amp. A first current source is coupled between a first potential and the control terminal. A second current source is coupled between the threshold potential and the source of the third field effect transistor.

In another example, a method for controlling a control terminal of a power transistor includes supplying a first current to the control terminal and supplying a second current to the control terminal until the voltage on the control terminal is greater than a threshold voltage. In another example, the power transistor is a field effect transistor.

Modifications are possible in the described embodiments, and other embodiments are possible within the scope of the claims.

What is claimed is:

1. An integrated circuit for controlling a connection between a power supply and a supplied node, comprising:
   a control terminal for coupling to a gate of a first field effect transistor having a current conduction path coupled between the power supply and the supplied node;
   a voltage rate rise reference having an output voltage with a selectable rise rate;
   an operational amplifier having an inverting input coupled to the output voltage of the voltage rate rise reference and having an output coupled to a gate of a second field effect transistor, a source of the second field effect transistor coupled to a reference potential;
   a third field effect transistor having a gate coupled to a threshold potential, a source coupled to a drain of the second field effect transistor and a drain coupled to the control terminal;
   a voltage divider having an undivided voltage input coupled to the control terminal and a divided voltage output coupled to a non-inverting input of the operational amplifier;
   a first current source coupled between a first potential and the control terminal; and
   a second current source coupled between the threshold potential and the source of the third field effect transistor.

2. The integrated circuit of claim 1 in which the first field effect transistor is formed in the same substrate as the controller.

3. The integrated circuit of claim 1 in which the first field effect transistor is not formed in the same substrate as the controller.

4. The integrated circuit of claim 1 in which the second current source includes:
   a first current source transistor having a source coupled to the threshold potential and a drain coupled to the source of the third field effect transistor; and
   a second current source transistor having a source coupled to the threshold potential, a gate coupled to a gate of the first current source transistor and a drain coupled to the gate of the second current source transistor and coupled to the reference potential via a fixed current source.

5. The integrated circuit of claim 1 in which the second current source has a higher current capacity than the first current source.

6. The integrated circuit of claim 1, in which the first current source is supplied by a charge pump.

7. A method for controlling a control terminal of a power transistor comprising:
   supplying a first current from a first current source to a control terminal of a power transistor;
   supplying a second current through a cascode transistor from a second current source separate from the first current source to the control terminal until a voltage on the control terminal is greater than a threshold voltage, the second current being greater than the first current; and
   draining charge from the control terminal through the cascode transistor and a feedback control transistor.

8. The method of claim 7 including selectively controlling the rise rate of the voltage on the control terminal.

9. The method of claim 7 in which the threshold voltage is greater than a threshold voltage of the power transistor.

10. The method of claim 7 in which the first current charges a gate to drain capacitance of the power transistor and the second current charges a gate to source capacitance of the power transistor.

11. The method of claim 7 including controlling the feedback control transistor with a feedback loop coupled to the control terminal.

12. The method of claim 7 including controlling the feedback control transistor with a feedback loop coupled to the control terminal and with a capacitor controlling a ramp up of the power transistor.

* * * * *